(12) United States Patent
Aromin et al.

(10) Patent No.: US 10,984,923 B2
(45) Date of Patent: *Apr. 20, 2021

(54) LCDI POWER CORD

(71) Applicant: Tower Manufacturing Corporation, Providence, RI (US)

(72) Inventors: Victor V Aromin, West Warwick, RI (US); Louis Jay Shatkin, Warwick, RI (US)

(73) Assignee: Tower Manufacturing Corp., Providence, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/935,895

(22) Filed: Jul. 22, 2020

(65) Prior Publication Data

US 2021/0027915 A1  Jan. 28, 2021

Related U.S. Application Data

(60) Provisional application No. 62/876,960, filed on Jul. 22, 2019, provisional application No. 62/880,970, filed on Jul. 31, 2019.

(51) Int. Cl.
| | | |
|---|---|---|
| *H02H 3/00* | (2006.01) |
| *H01B 7/32* | (2006.01) |
| *G01R 31/52* | (2020.01) |
| *H01B 7/00* | (2006.01) |
| *H01B 7/22* | (2006.01) |
| *H01B 1/02* | (2006.01) |

(52) U.S. Cl.
CPC .............. *H01B 7/32* (2013.01); *G01R 31/52* (2020.01); *H01B 7/0018* (2013.01); *H01B 7/228* (2013.01); *H01B 1/023* (2013.01); *H01B 1/026* (2013.01)

(58) Field of Classification Search
None
See application file for complete search history.

(56) References Cited

U.S. PATENT DOCUMENTS

| | | | | |
|---|---|---|---|---|
| 5,642,248 A | * | 6/1997 | Campolo | ........... H01R 13/7135 361/115 |
| 7,307,211 B1 | * | 12/2007 | Caccia | .................... G01R 31/50 174/36 |
| 7,358,443 B2 | * | 4/2008 | Shatkin | ................... H01B 9/021 174/102 R |
| 9,123,458 B2 | * | 9/2015 | Griffin | ................... H01B 11/12 |

* cited by examiner

Primary Examiner — Stephen W Jackson

(57) ABSTRACT

A power cord with leakage current detection function includes an insulated neutral wire and aluminum foil wrapping or surrounding the neutral wire insulator. The neutral wire aluminum foil has a conductive side and a non-conductive side, wherein the non-conductive side is adjacent to the outside of the neutral wire insulator and the conductive side is facing outwards. The power cord also includes an insulated line wire surrounded by aluminum foil where the conductive side is facing outwards and in contact with the conductive side of the aluminum foil surround the neutral wire. The power cord also includes a copper braid surrounding an insulated ground wire, wherein the copper braid is in simultaneous electrical contact with the conductive sides of the line and neutral aluminum foil wraps.

10 Claims, 4 Drawing Sheets

LCDI POWER CORD

CROSS-REFERENCE TO RELATED APPLICATIONS

The present application is related to, claims the earliest available effective filing date(s) from (e.g., claims earliest available priority dates for other than provisional patent applications; claims benefits under 35 USC § 119(e) for provisional patent applications), and incorporates by reference in its entirety all subject matter of the following listed application(s) (the "Related Applications") to the extent such subject matter is not inconsistent herewith; the present application also claims the earliest available effective filing date(s) from, and also incorporates by reference in its entirety all subject matter of any and all parent, grandparent, great-grandparent, etc. applications of the Related Application(s) to the extent such subject matter is not inconsistent herewith:

U.S. provisional patent application 62/876,960, entitled "Power Cord", naming Victor V. Aromin as first inventor, filed 22 Jul. 2019; and U.S. provisional patent application 62/880,970, entitled "Power Cord", naming Victor V. Aromin as first inventor, filed 31 Jul. 2019.

BACKGROUND

1. Field of Use

This invention relates to a power cord. In particular, it relates to a power cord for an appliance that has a built-in leakage current detection and interruption (LCDI) conductor for detecting a leakage current in the power cord.

2. Description of Prior Art (Background)

With the wide use of household electrical appliances, such as air conditioners, washing machines, refrigerators, etc., more attention is being paid to the safety of using such appliances. An appliance typically has a power cord of one meter or longer. As shown in FIG. 1, such a power cord is made of three copper wires 11, 6 and 8 for carrying, power, three insulating layers (made of rubber or plastic) 10, 5, and 7 surrounding the respective copper wires, two metal sheaths 19 and 14 (made of thin copper wires woven together) surrounding two insulating layer, respectively, and an outer insulating layer 1 (made of rubber or plastic) enclosing the wires.

Such a power cord may age due to long-term use, or become damaged when the appliance is moved, which may cause a leakage between the phase line and the neutral or ground lines in the cord. Such leakage current may cause sparks, which may cause fire and property damages. To quickly and accurately detect leakage current in the power cord, an additional conductor is provided and electrically connected to the metal sheath 19, 14. Leakage current can be detected by detecting a voltage on the metal sheath.

The metal sheaths are conventionally made by weaving thin copper wires. The cost of the power cord has increased due to the increase cost of the copper material.

Another prior art solution is shown in FIG. 2. A power cord includes three copper wires 11, 6 and S for carrying power and a leakage current detection conductor 3 for detecting a leakage current in the power cord. As before the three copper wires 11, 6 and S are surrounded by three insulating layers (made of rubber or plastic) 10, 5, and 7, respectively. Two insulating layers 10, 5 are surrounded by metal conductive layers 9, 4, respectively. The leakage current detection conductor 3 is provided adjacent the two metal conductive layers 9, 4 and is in contact with both of them. A metal sheath 2 encloses the three wires with their respective insulating layers and metal conductive layers as well as the leakage current detection conductor 3. An outer insulating layer 1 (made of rubber or plastic) is provided outside of the metal sheath 2.

The metal conductive layers 9, 4 may be made of a thin copper foil, tin foil, aluminum foil, or conductive rubber. The leakage current detection conductor 3 may be formed of one or more copper wires or aluminum wires.

When leakage current is present between copper wires 11 and 6, 11 and 8, or 6 and 8, the leakage current detection conductor 3 can detect the leakage current via the metal conductive layers 9 or 4. As shown in FIG. 2, this prior art solution requires another conductive sheath 2 surrounding all the cables and the detection conductor 3.

BRIEF SUMMARY

Accordingly, the present invention provides a power cord useful for appliances such as air conditioners, washing machines, refrigerators, etc. which has a built-in leakage current detection conductor for detecting a leakage current in the power cord.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The following brief definition of terms shall apply throughout, the application:

The term "comprising" means including but not limited to, and should be interpreted in the manner it is typically used in the patent context;

The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment);

If the specification describes something as "exemplary" or an "example," it should be understood that refers to a non-exclusive example; and If the specification states a component or feature "may," "can," "could," "should," "preferably," "possibly," "typically." "optionally," "for example," or "might" (or other such language) be included or have a characteristic, that particular component or feature is not required to be included or to have the characteristic.

Figure 1:
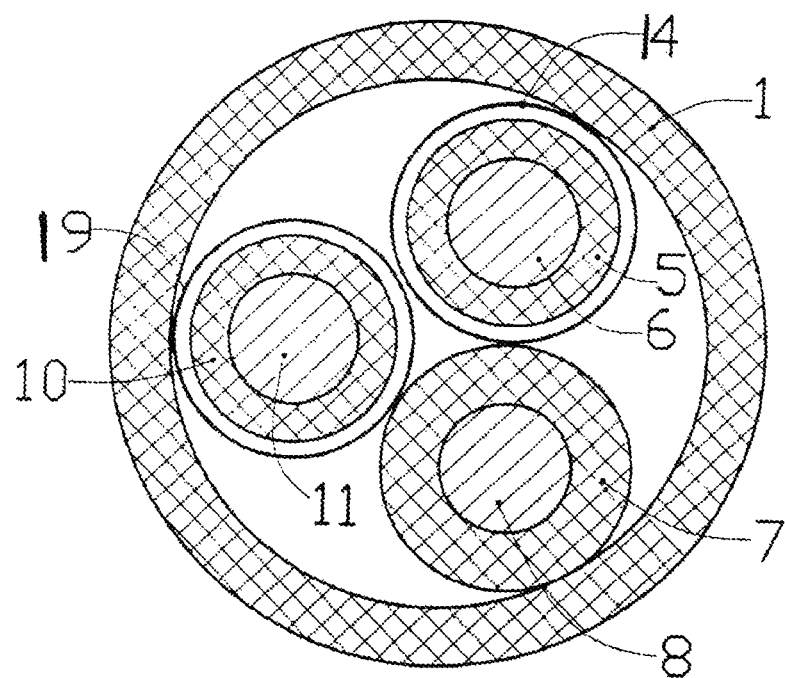
FIG. 1 is a cross-sectional view showing the structure of a conventional power cord.
Figure 2:
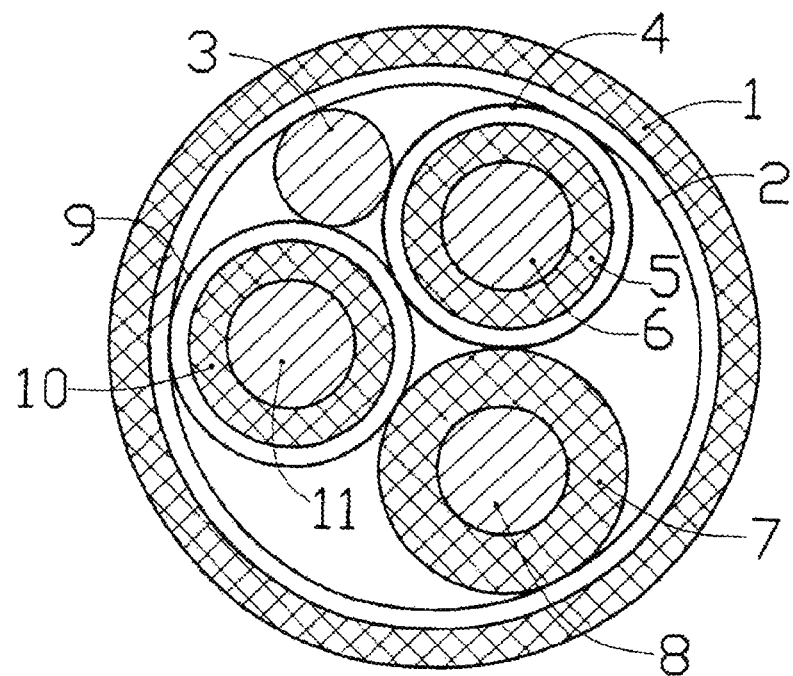
FIG. 2 is a cross-sectional view showing the structure of another conventional power cord with a leakage current detection conductor.
Figure 3A:
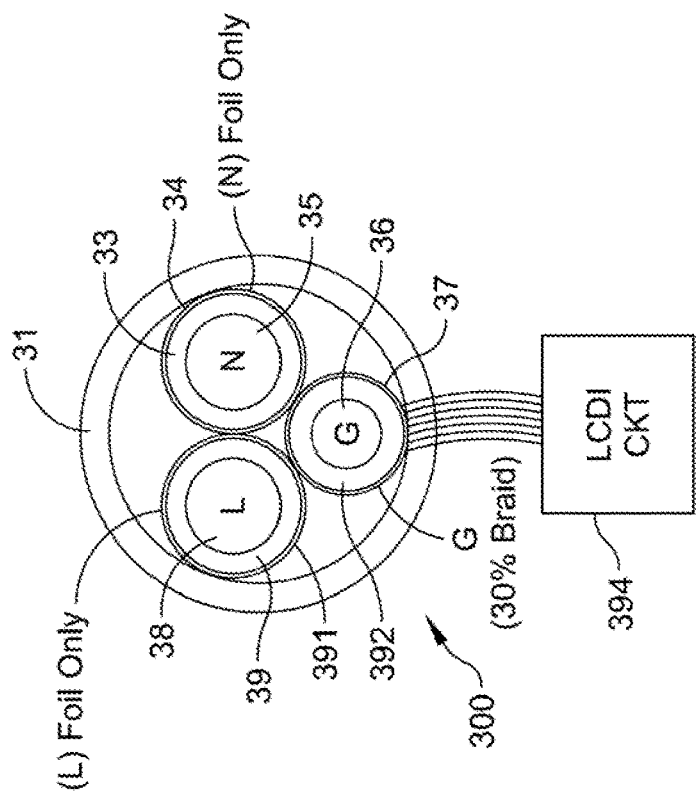
FIG. 3A is a cross-sectional view showing the structure the power cord shown in FIG. 3.
Figure 3:
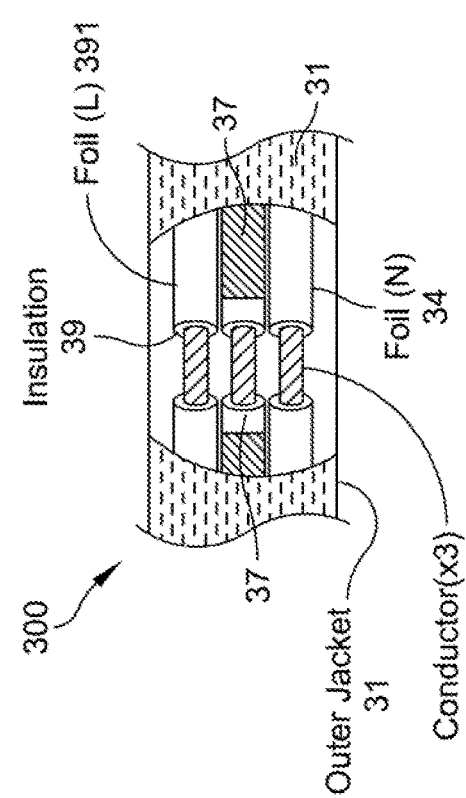
FIG. 3 is a cut away side view showing the structure of a power cord with leakage current detection conductors according to an embodiment of the present invention.

Referring now to FIG. 3 and FIG. 3A of the drawings, there is shown a cut away side view showing the structure of a power cord 300 with leakage current detection conductors according to an embodiment of the present invention and a cross-sectional view showing the structure the power cord 300, respectively. In this embodiment the power cord 300 includes a neutral wire or cable 35, a line wire or cable 38, and a ground wire 36. Each of the wire or cables is surrounded by an insulator layer 33, 39, and 392. In addition, the insulating layers 39 and 33 of the line wire 38 and the neutral wire 33, respectively, are each surrounded by a conductive aluminum foil, 391 and 34, respectively. It will be appreciated that the aluminum foil 391, 34 has a conductive side and a non-conductive or less conductive side. The aluminum foil 391, 34 may be a foil, shielding comprising a thin layer of aluminum and mylar composite tape. The conductive side of aluminum foil 391, 34 is facing outwards and the less, or non-conductive side of the aluminum foil is facing inwards.

The ground wire 36 insulator layer 392 is surrounded by a copper braid 37. The copper braid 37 may be any suitable copper or tinned copper braid woven to cover 30% of the surface area of the outer surface of a unit length of insulator 392. At least one end of the copper braid 37 may be connected to an LCDI circuit 394. It will be appreciated that copper braid 37 is in simultaneous contact with the conductive sides of aluminum foil 391 and 34.

Still referring to FIG. 3 and FIG. 3A, it will be understood that any if insulators 33 or 39 become defective and current leaks to the conductive side of aluminum foil 391 or 34 the current will pass to copper braid 37 where it will be detected by LCDI circuit 394.

It will also be appreciated that aluminum foil 391, 34 layers and copper braid 37 may also act as an RF shield.

Figures 4, 4A:
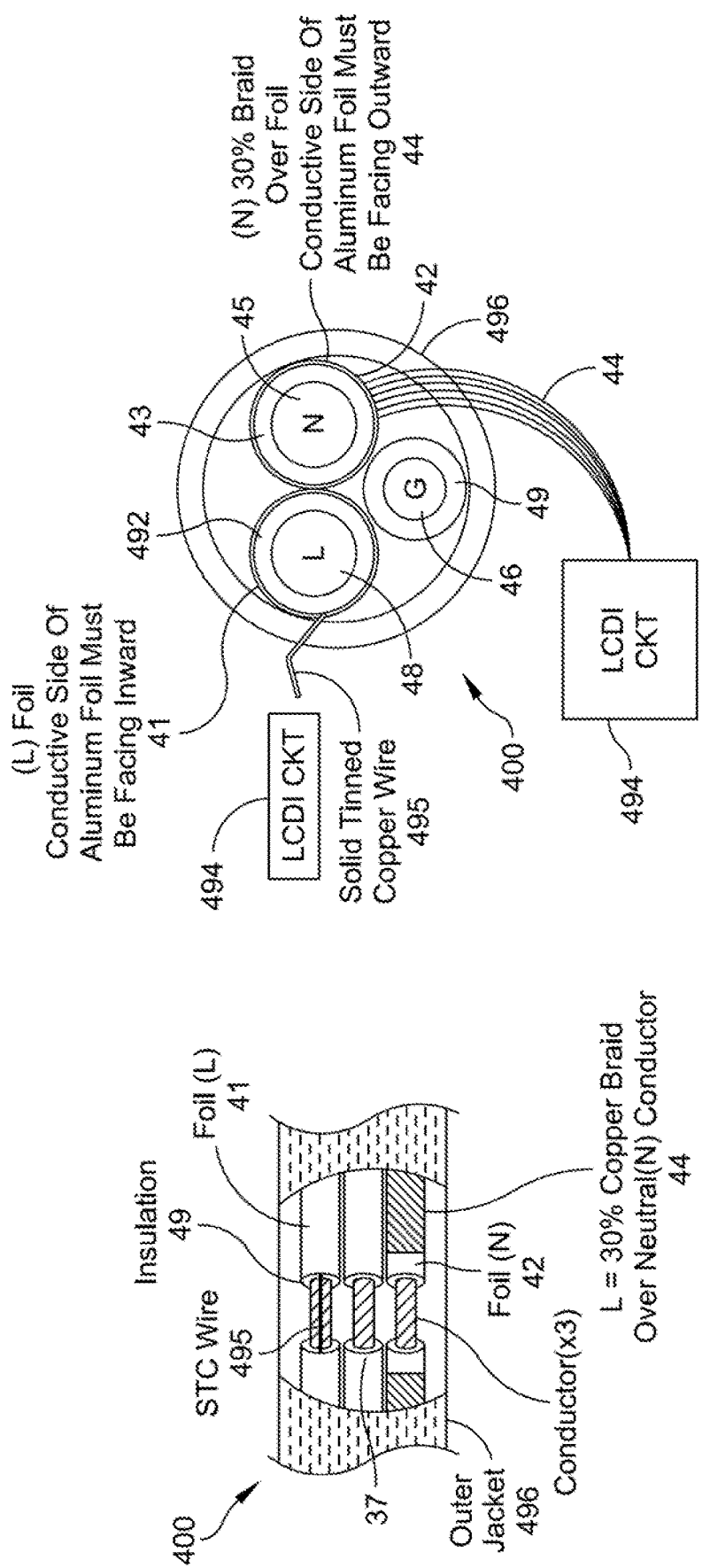
FIG. 4 is a cut away side view showing the structure of a power cord with leakage current detection conductors according to an alternate embodiment of the present invention.
FIG. 4A is a cross-sectional view showing the structure the power cord shown in FIG. 4.

Referring now to FIG. 4 and FIG. 4A of the drawings, there is shown a cut away side view showing the structure of a power cord 400 with leakage current detection conductors according to an alternate embodiment of the present invention. In this embodiment the power cord 400 includes a neutral wire or cable 45, a line wire or cable 48, and a ground wire 46. Each of the wire or cables is surrounded by an insulator layer 43, 49, and 492. In addition, the insulating layers 492 and 43 of the line wire 48 and the neutral wire 45, respectively, are each surrounded by a conductive aluminum foil, 41 and 44, respectively. It will be appreciated that the aluminum foil 41, 44 has a conductive side and a non-conductive or less conductive side. The aluminum foil 41, 44 may be a foil shielding, comprising a thin layer of aluminum and mylar composite tape. The conductive side of aluminum foil 41 is facing inwards and the less, or non-conductive side of the aluminum foil is facing inwards. The conductive side of aluminum foil 44 is facing outwards.

Still referring to FIG. 4 and FIG. 4A power cord 400 also includes a solid tin copper wire 495 disposed between aluminum foil 41 and insulator 492.

The conductive side of aluminum foil 44 is surrounded by a copper braid 44. The copper braid 44 may be any suitable copper or tinned copper braid woven to cover 30% of the surface area of the outer surface of insulator 43. At least one end of the copper braid 44 may be connected to an LCDI circuit 494. In addition, at least one end of the wire 495 may also be connected to the LCDI circuit 494.

It will be understood that any if insulators 492 or 43 become defective and current leaks to the conductive side of aluminum foil 41 or 42 the current will pass to copper braid 44 or wire 495 where it will be detected by LCDI circuit 494.

Figure 5A:
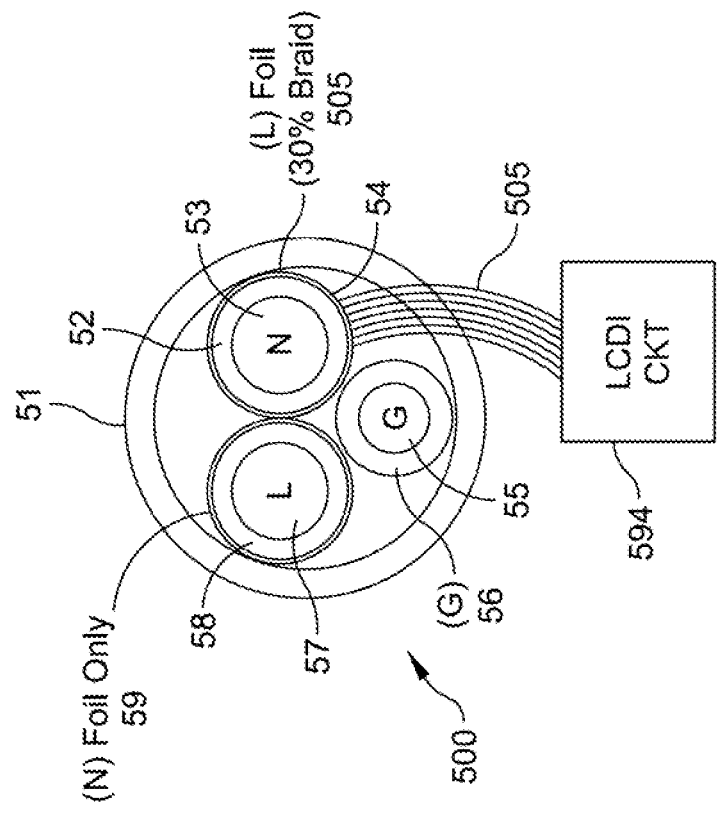
FIG. 5A is a cross-sectional view showing the structure the power cord shown in FIG. 5.
Figure 5:
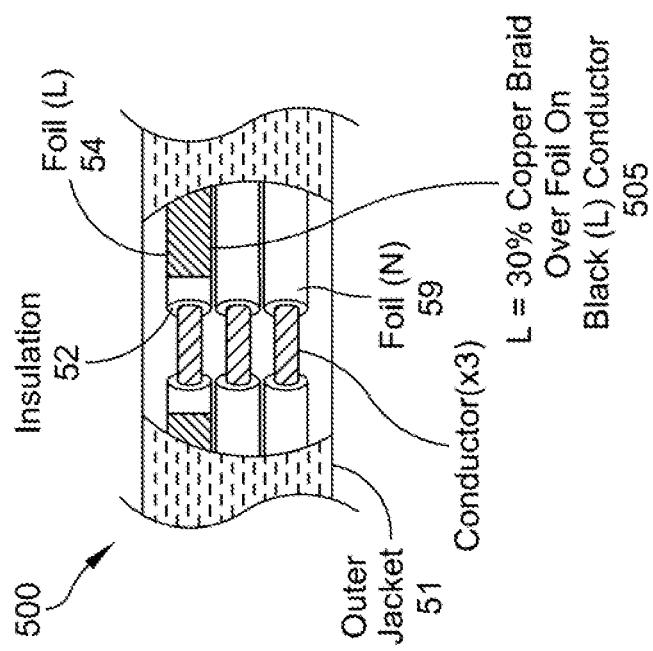
FIG. 5 is a cut away side view showing the structure of a power cord with leakage current detection conductors according to an embodiment of the present invention.

Referring now to FIG. 5 and FIG. 5A there is shown a cut away side view showing the structure of a power cord with leakage current detection conductors according to an embodiment, of the present invention, and a cross-sectional view showing the structure the power cord shown in FIG. 5, respectively. In this embodiment the power cord 500 includes a neutral wire or cable 57, a line wire or cable 53, and a ground wire or cable 55. Each of the wires 53, 55, and 57 is surrounded by an insulator 52, 56, and 58, respectively. Insulators 52 and 58 are surrounded by aluminum foil 54 and 59, respectively. Aluminum foil 54 is surrounded by copper braid 505. At least one end of copper braid 505 is connected to LCDI circuit 594.

The conductive side of aluminum foil 54, 59 is facing outwards and the less, or non-conductive side of the aluminum foil is facing inwards.

It will be understood that any if insulators 52 or 58 become defective and current leaks to the conductive side of aluminum foil 54 or 459 the current will pass to copper braid 505 where it will be detected by LCDI circuit 594.

It should be understood that the foregoing description is only illustrative of the invention. Thus, various alternatives and modifications can be devised by those skilled in the art without departing from the invention. Accordingly, the present invention is intended to embrace all such alternatives, modifications and variances that fall within the scope of the appended claims.

What is claimed is:

1. A power cord with leakage current detection function, comprising:
   a neutral wire;
   a neutral wire insulator surrounding the neutral wire;
   a first aluminum foil surrounding the neutral wire insulator, wherein the first aluminum foil comprises:
      a first conductive side; and
   a first non-conductive side, wherein the non-conductive side is adjacent to the outside of the neutral wire insulator;
      a line wire;
   a line wire insulator surrounding the line wire;
   a second aluminum foil surrounding the line wire insulator, wherein the second aluminum foil comprises:
      a second conductive side; and
   a second non-conductive side, wherein the second non-conductive side is adjacent to the outside of the line wire insulator;
      a ground wire;
      a ground wire insulator surrounding the ground wire; and
   a copper braid surrounding the ground wire insulator, wherein the copper braid is in simultaneous electrical contact with the first and second conductive sides of time first and second aluminum foil, respectively.

2. The power cord as in claim 1 further comprising a Leakage Current Detector Interrupter (LCDI) circuit connected to the copper braid.

3. The power cord as in claim 1 wherein the copper braid further comprises a 30% copper braid coverage per unit length of the power cord.

4. A power cord with leakage current detection function, comprising:
a neutral wire;
a neutral wire insulator surrounding the neutral wire;
a first aluminum foil surrounding the neutral wire insulator, wherein the first aluminum foil comprises:
a first conductive side; and
a first non-conductive side, wherein the non-conductive side is adjacent to the outside of the neutral wire insulator;
a copper braid surrounding and adjacent to the first conductive side of the first aluminum foil;
a line wire;
a line wire insulator surrounding the line wire;
a second aluminum foil surrounding the line wire insulator, wherein the second aluminum foil comprises:
a second non-conductive side;
a second conductive side, wherein the second conductive side is adjacent to the outside of the line wire insulator, and wherein the second conductive side is adjacent to the first non-conductive side;
a solid tinned copper wire disposed between the second aluminum foil and the line wire insulator
a ground wire; and
a ground wire insulator surrounding the ground wire.

5. The power cord as in claim 4 further comprising a Leakage Current Detector Interrupter (LCDI) circuit connected to the copper braid.

6. The power cord as in claim 5 further comprising the Leakage Current Detector Interrupter (LCDI) circuit connected to the solid tinned copper wire.

7. The power cord as in claim 4 wherein the copper braid further comprises a 30% copper braid coverage per unit length of the power cord.

8. A power cord with leakage current detection function, comprising:
a line wire;
a line wire insulator surrounding the line wire;
a first aluminum foil surrounding the line wire insulator, wherein the first aluminum foil comprises:
a first conductive side; and
a first non-conductive side, wherein the non-conductive side is adjacent to the outside of the line wire insulator;
a copper braid surrounding and adjacent to the first conductive side of the first aluminum foil;
a neutral wire;
a neutral wire insulator surrounding the line wire;
a second aluminum foil surrounding the neutral wire insulator, wherein the second aluminum foil comprises:
a second conductive side;
a second non-conductive side, wherein the second non-conductive side is adjacent to the outside of the neutral wire insulator, and wherein the second conductive side is adjacent to the first conductive side;
a ground wire; and
a ground wire insulator surrounding the ground wire.

9. The power cord as in claim 8 further comprising a Leakage Current Detector Interrupter (LCDI) circuit connected to the copper braid.

10. The power cord as in claim 8 wherein the copper braid further comprises a 30% copper braid coverage per unit length of the power cord.

* * * * *